United States Patent
Kwon

(10) Patent No.: US 8,135,146 B2
(45) Date of Patent: Mar. 13, 2012

(54) EQUALIZATION METHOD USING EQUAL LOUDNESS CURVE BASED ON THE IS0266:2003 STANDARD, AND SOUND OUTPUT APPARATUS USING THE SAME

(76) Inventor: Dae-Hoon Kwon, Seoul (KR)

( * ) Notice: Subject to any disclaimer, the term of this patent is extended or adjusted under 35 U.S.C. 154(b) by 761 days.

(21) Appl. No.: 12/302,389

(22) PCT Filed: May 9, 2007

(86) PCT No.: PCT/KR2007/002282
§ 371 (c)(1),
(2), (4) Date: Nov. 25, 2008

(87) PCT Pub. No.: WO2007/139294
PCT Pub. Date: Dec. 6, 2007

(65) Prior Publication Data
US 2009/0232329 A1    Sep. 17, 2009

(30) Foreign Application Priority Data
May 26, 2006   (KR) .......................... 10-2006-0047556

(51) Int. Cl.
*H03G 5/00* (2006.01)
(52) U.S. Cl. ...................................... 381/103; 381/94.1
(58) Field of Classification Search ................. 381/94.1, 381/103
See application file for complete search history.

(56) References Cited

U.S. PATENT DOCUMENTS
2004/0131200 A1    7/2004  Davis
2008/0267425 A1*  10/2008  Le Faucheur et al. ....... 381/94.1

FOREIGN PATENT DOCUMENTS
JP    2005-136635     5/2005
WO    2004/036954     4/2004

OTHER PUBLICATIONS
Definition of "Equal-Loudness Contour", Wikipedia, Oct. 2011.*

* cited by examiner

*Primary Examiner* — Thanh V Pham
(74) *Attorney, Agent, or Firm* — Ladas & Parry LLP

(57) ABSTRACT

An equalization method using equal loudness curve, and a sound output apparatus using the same are disclosed. An audio signal is equalized using a standard loudness curve so as to increase a loudness of an audio signal. A sound quality can be significantly enhanced with the enhancement of a sound cleanness and quality when being adapted to a communication apparatus such as a telephone terminal, a transmitter or a repeater. When it is adapted to an audio apparatus such as a MP3, a common audio system, a car audio system, etc., it is possible to enhance a sound cleanness and quality, and a hearing ability. It can be used as a hearing aid.

11 Claims, 4 Drawing Sheets

EQUALIZATION METHOD USING EQUAL LOUDNESS CURVE BASED ON THE IS0266:2003 STANDARD, AND SOUND OUTPUT APPARATUS USING THE SAME

TECHNICAL FIELD

The present invention relates to an equalization method using a standard equal loudness contour of a human being and a sound output apparatus using the same, and in particular to an equalization method using a standard equal loudness contour, and a sound output apparatus using the same in which a sound quality can be enhanced by equalizing a sound data based on an ISO266 standard audiogram upgraded in 2003 and a statistic of hearing in a repeater or a terminal of a communication equipment or a sound instrument.

BACKGROUND ART

A sound pressure (intensity of sound), which is physically or electrically measured, does not match with the level of sound that a human being can feel via an auditory organ. Since the ears of a human being have irregular response characteristics with respect to an audible frequency sound, the levels of sound that a human being can hear may be different depending on the bandwidth of each frequency even in case of same sound pressure. Even when a human being hears the sound with the same physical sound pressure, the human being can recognize different levels of sound depending on the bandwidth of sound frequency owing to the hearing characteristic of a human being.

A personal information communication system (personal information communication system having sound or voice playback functions) such as a communication terminal, a sound instrument, etc. is provided with a sound level amplification function, which may damage a user's hearing ability. Since almost users hear sound or voice with a higher volume, the hearing ability may be easily damaged. So, the mild hearing loss (impairment) increases. Since a user generally prefers to hear music with a higher volume, the loss of hearing ability may be serious problems. So, people suffering from moderate and severe hearing loss increase more and more.

When a conventional personal information communication system plays back sound or voice, since it plays back an audio signal such as sound, voice, etc. without considering a loudness level of a human being, a hearing ability may lose.

In case of a conventional personal information communication system, almost volumes are linearly controlled. Namely, in case that the volume is set to 90 dB HL, a certain part of the sound is outputted with 60 dBHL, so that a user feels less hearing fatigue, but the other parts of the same are outputted with 90 dB HL. Thus, the user feels more hearing fatigue owing to sound distortion which may damage user's ears. In this case, the user adjusts the volume for hearing the sound of a certain frequency bandwidth, and the volume is linearly adjusted, so that the pressure of sound of all frequency bandwidths increases, whereby auditory organ cells, which react to the sound of a certain frequency bandwidth, may be damaged.

Here, an equalization method may be used for preventing the damages of auditory organ cells which occur owing to a linear control of the personal information communication system, so that the sounds can be independently controlled depending on their frequency bandwidths.

An equalizer is designed so that a user can hear his desired sound tones. For example, a user who prefers to hear a clean and elegant frequency bandwidth can hear his desired sound by increasing higher frequency bandwidths of the equalizer. When a big and strong sound is needed, lower frequency bandwidths are increased.

However, when the equalizer is used, the user needs to set up the equalizer, which causes inconvenience. Even when the user uses the equalizer, it is not sure to enhance hearing ability, sound quality and sound feeling.

DISCLOSURE OF INVENTION

Accordingly, it is an object of the present invention to provide a method for equalizing a sound data using a 2003 year-upgraded ISO standard audiogram and statistics of hearing in a repeater or terminal of a communication equipment or a sound instrument.

It is another object of the present invention to provide a sound output apparatus which is able to perform equalization using a standard audiogram of a human being.

To achieve the above objects, in a method for equalizing an audio signal of a communication repeater, communication equipment and a sound instrument, there is provided an equalization method using a standard equal loudness curve which comprises a step for equalizing an audio signal using a standard audiogram for increasing a loudness of an audio signal.

To achieve the above objects, in a sound output apparatus for converting an electric audio signal into an audible sound, there is provided a sound correction output apparatus using a standard equal loudness curve which comprises an interface which is connected with a sound instrument and receives an audio signal from the sound instrument; a memory which stores a standard audiogram; an audio signal process unit which equalizes an audio signal inputted via the interface in accordance with a standard audiogram stored in the memory; an output unit which coverts an analog signal, which is outputted from the audio signal process unit, into a sound and outputs the same; and a control unit which controls the operations of the memory and the audio signal process unit.

BRIEF DESCRIPTION OF THE DRAWINGS

The present invention will become better understood with reference to the accompanying drawings which are given only by way of illustration and thus are not limitative of the present invention, wherein.

BEST MODE FOR CARRYING OUT THE INVENTION

A preferred embodiment of an equalization method using an equal loudness contour according to the present invention will be described with reference to the accompanying drawings.

Figure 1:
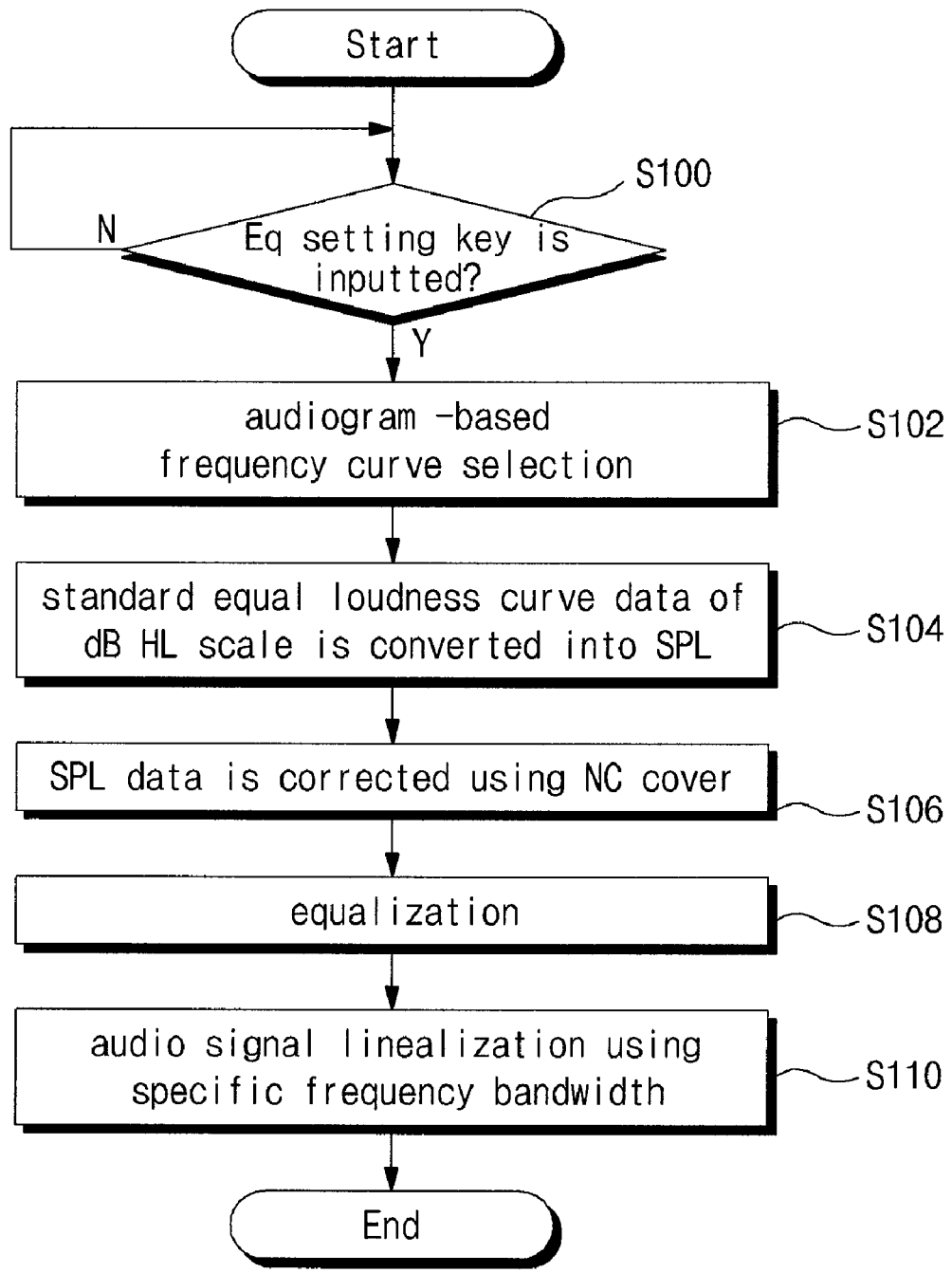
FIG. 1 is a flow chart of an equalization procedure using a standard audiogram according to a preferred embodiment of the present invention.

FIG. 1 is a flow chart of an equalization procedure using a standard audiogram according to an embodiment of the present invention.

The equalization method using a standard audiogram according to the present invention is implemented in a module type and is mounted on a communication terminal, a personal information communication system, which is able to play back music or a communication repeater. It may be implemented based on a hardware method.

In the following descriptions, it is assumed that the present invention is mounted on a personal information communication system (hereinafter referred to "information communication system") such as a MP3 player which is able to play back music. It is not limited to the disclosed embodiments.

When a user of an information communication system outputs a control signal for performing an equalization function by operating a certain key of the information communication system so as to execute an equalization procedure using a standard audiogram, the equalization procedure using an equal loudness curve according to the present invention starts in a step S100. The equalization may be set basically even when there is not a key input depending on a user's option.

Next, when the user selects an audiogram statistic which will be used for equalization, the equalization is performed using equal loudness level statistics selected by the user in a step S102. Here, for the audiogram characteristic curve, various standard audiogram statistics such as a Korean standard audiogram statistic, an audiogram statistic by ages, a standard audiogram statistic of a human being, etc. may be used. The user can select certain a certain audiogram statistic for the use of his desired equalization. Here, the audiogram statistic is referred to a standard statistic, which presents an auditory characteristic of a human being based on each frequency bandwidth.

Figure 2:
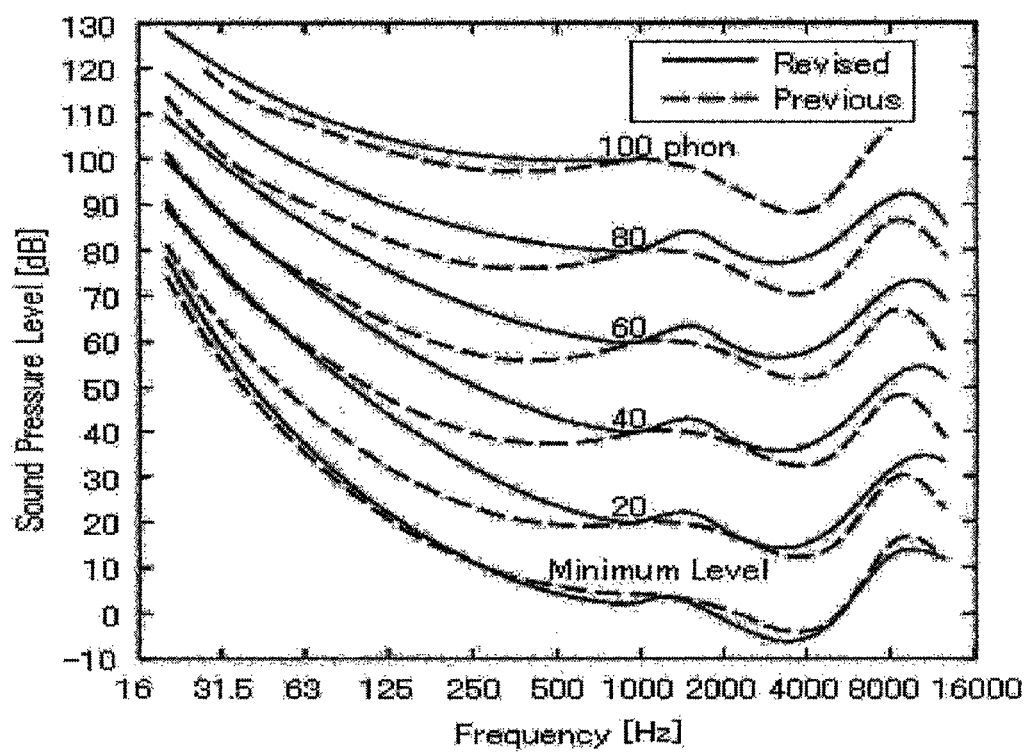
FIG. 2 is a view of an equal loudness contour based on ISO226:2003 standard.

FIG. 2 is a view of an equal loudness contour based on ISO226:2003 standard which is an international loudness curve recommended by the ISO.

The standard audiogram statistic used in the present invention preferably uses the equal loudness contour (hereinafter referred to "ELC") based on the ISO226:2003 standard of FIG. 2. As shown in FIG. 2, the hearing characteristic of a human being is very insensible at a low frequency bandwidth, and is very sensible at a high frequency bandwidth.

According to the 2003 year-upgraded ISO266, there are not changes in the frequency curve (ELC curve) from 250 Hz to 80 KHz with respect to the dynamic changes, which shows a big difference as compared to the conventional ELC (ISO266).

So, the conventional ELC was not used for an audio instrument. However, in case that the ELC upgraded since 2003 is directly adapted to sound equipment, it is possible to implement a sound equipment having performance most similar with the audiogram of a human being. In this case, it is possible to enhance sound quality and cleanness as well as hearing protection.

In the present invention, a procedure for correcting a frequency bandwidth based signal of an audio signal is performed so that a user can hear a uniform sound level at all frequency bandwidths using the equal loudness contour of the ISO226:2003 standard of FIG. 2.

The equal loudness contour data based on the ISO266:2003 standard is converted into the data of the SPL (sound pressure level) scale based on the dB HL scale so as to perform the above-described audio signal correction in a step S104.

Next, the noise criteria curve (approximate threshold hearing for continuous noise) is adapted to the equal loudness contour converted into the SPL scale so as to minimize the effects of noises in a step S106.

Figure 3:
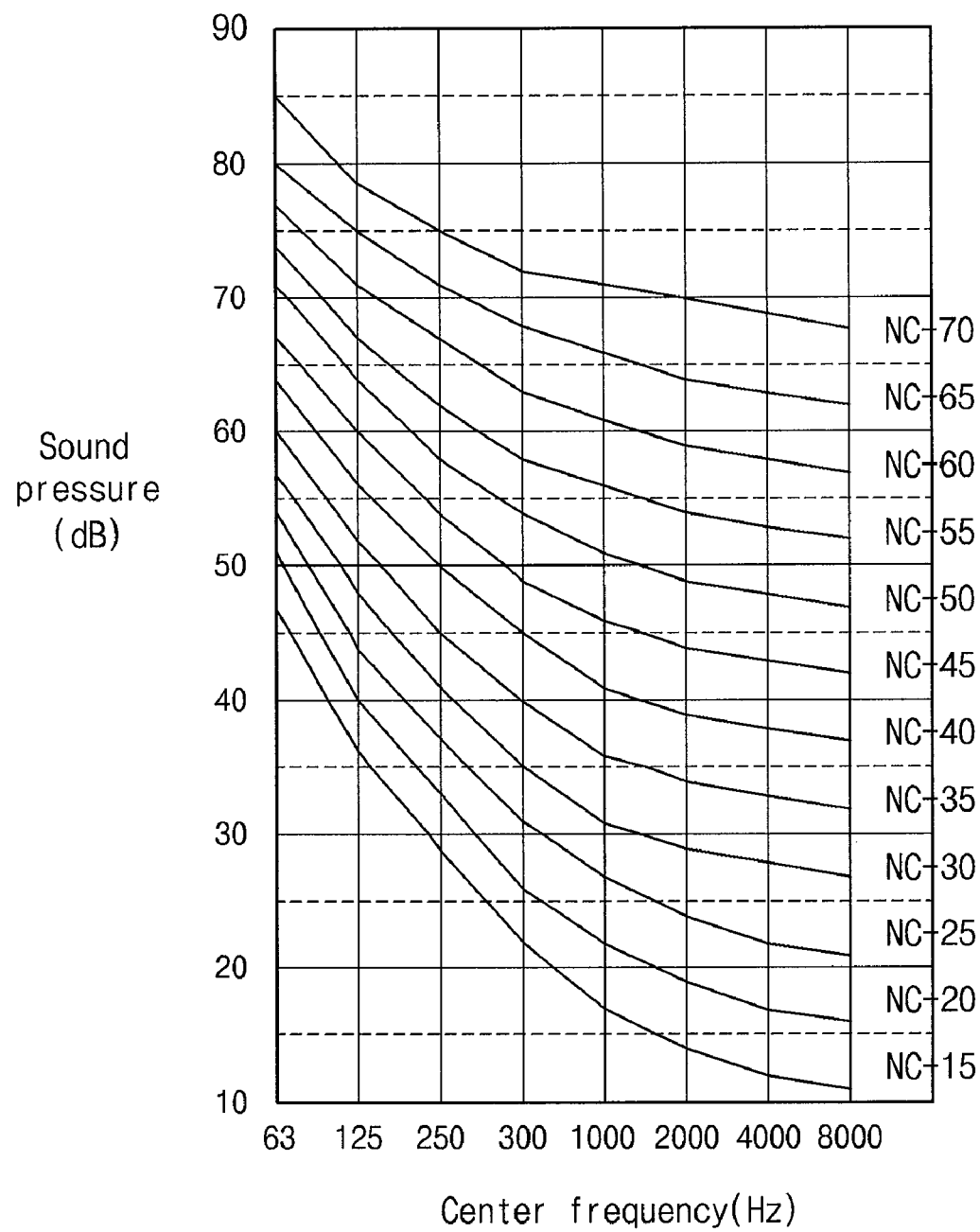
FIG. 3 is a view of a noise criteria curve based on ISO standard.

FIG. 3 is a view illustrating a noise criteria curve based on the ISO standard. As shown therein, the NC levels (NC-20, NC-30, etc.) represents a noise criteria based on each frequency bandwidth.

In the present invention, the equalization is performed using a noise criteria curve based on the ISO standard so that an audio signal maintains a range from NC-20 level to a NC-40 level after the equalization is performed.

An audio signal is equalized using an equal loudness contour which adapts a noise criteria curve. Here, the audio signals of frequency bandwidths of 250 Hz, 500 Hz, 1 KHz, 2 KHz, 4 KHz, and 8 KHz are equalized using an equal loudness contour which adapts a noise criteria curve in a step S108.

Finally, the audio signals of the frequency bandwidths close to the bandwidths of 250 Hz and 8 KHz of the equalized audio signals are linearly processed in a step S110. The uneasiness of sound is minimized by linearly processing the close frequencies based on the frequency equalizer values in case of 250 Hz and 8 KHz. As shown in FIG. 2, since the equal loudness contour sharply changes at the frequency bandwidths of 250 Hz and 8 KHz, the uneasiness of sound occurs when only the signals of 250 Hz and 8 KHz are corrected. In order to overcome the above problems, in the present invention, the signals of certain ranges are linearly processed with respect to the bandwidths of 250 Hz and 8 KHz based on the corrected audio signals of the bandwidths of 250 Hz and 8 KHz.

Figure 4:
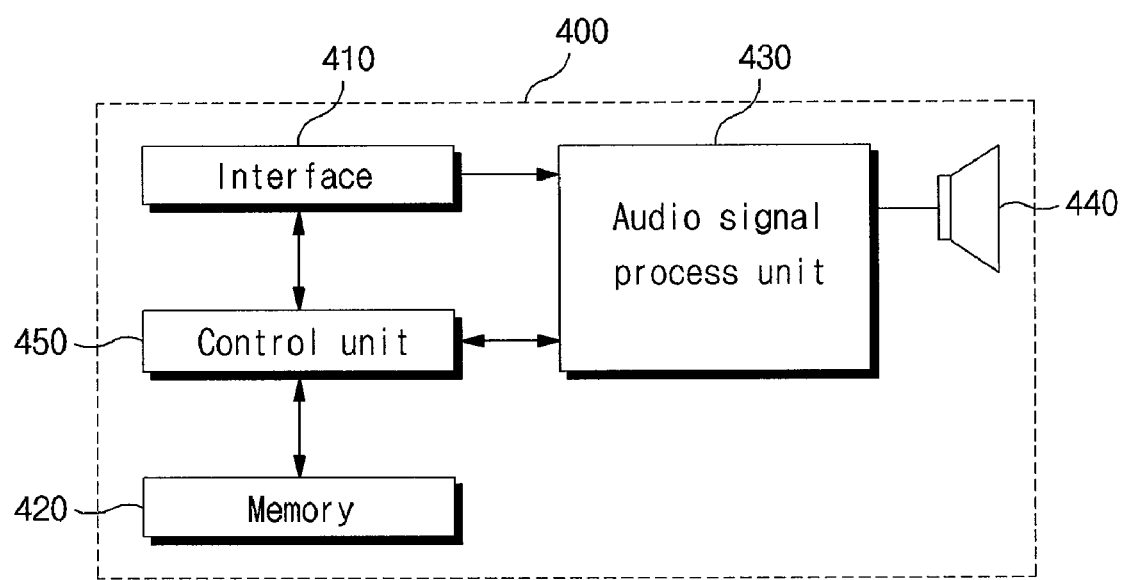
FIG. 4 is a block diagram illustrating a construction of a sound quality correction output apparatus using a standard audiogram according to a preferred embodiment of the present invention.

FIG. 4 is a block diagram illustrating a construction of a sound quality correction output apparatus using a standard audiogram characteristic according to an embodiment of the present invention. The sound quality correction output apparatus using a standard audiogram characteristic may be adapted to a sound output apparatus of a communication instrument such as a cellular phone terminal and a sound output apparatus (speaker, headphone, earphone, etc.) connected with a sound instrument such as a MP3 player, etc. The sound output apparatus of FIG. 4 is a sound output apparatus 400, which uses an equalization method using a standard audiogram characteristic. As shown therein, the sound output apparatus comprises an interface 410, a memory 420, an audio signal process unit 430, an output unit 440 and a control unit 450.

The interface 410 receives an audio signal in a wire or a wireless method. When the apparatus of the present invention is designed to transmit an audio signal in a local area wireless communication method, the interface 410 receives an audio signal via an antenna (not shown) and demodulates and amplifies the signal. At this time, the interface 410 may be formed of at least one among various interfaces (in case of wireless communication, it is referred to an interface which can support a local area wireless communication method such as RFID, Bluetooth, etc., and in case of wires communication, it is referred to an interface such as USB, serial port, etc.) depending on a wireless communication method which will be used.

In case of a communication based on the Bluetooth standard, the interface 410 may be formed of a Bluetooth module. In case of an IrDA (Infrared Data Association) or a RF (Radio Frequency), which are different wireless communication standards, it may be formed of an IrDA receiver or a RF receiver.

The memory 420 generally stores a standard audiogram of a human being. The memory 420 according to the present invention performs an equalization using the standard audiogram characteristic and stores a set data of the generated standard equalization. In case that the sound output apparatus 400 is constituted with the above construction of the present invention, the audio signal process unit 430 does not perform a processing procedure, but equalizes an audio signal using the set data of the equalization stored in the memory 420.

The audio signal process unit 430 equalizes an audio signal from the interface 410 based on the standard audiogram of a human being or a standard equalization set data stored in the memory 420 in accordance with a control signal from the control unit 450 and amplifies the signal into an analog signal and amplifies the same.

The output unit 440 connected with an output terminal of the audio signal process unit 430 converts an analog signal outputted from the audio signal process unit 430 into sound that a human being can here.

The control unit 450 controls the functions of the interface 410, the memory 420 and the audio signal process unit 430, respectively, so that a sound quality correction output apparatus based on an equal loudness curve according to the present invention can properly operate.

The operation of the sound output apparatus 200 according to the present invention will be described.

A user of the sound output apparatus 400 operates a certain key (not shown) of the sound output apparatus 400 for performing an equalization function using a standard audiogram, and a control signal is outputted for performing an equalization function, the sound output apparatus 400 according to the present invention starts performing an equalization using a standard audiogram. The system may be set and basically operates as equalization is performed using a standard equal loudness curve depending on a user's set option even when there is not a key input.

When the user selects a standard audiogram statistic which will be used for an equalization, the sound output apparatus 400 performs an equalization using the audiogram statistic selected by the user among the standard audiograms stored in the memory 420. The standard audiogram statistic may consist of a Korean standard audiogram statistic, an audiogram statistic by ages, a standard audiogram statistic of a human being, etc. Here, the user can select a certain audiogram statistic for equalization. Here, the audiogram statistic refers to a standard statistic which shows an audiogram characteristic of a human being based on each frequency bandwidth. The standard audiogram statistic used in the present invention is preferably an Equal Loudness Contour (hereinafter referred to "ELC") based on the ISO226:2003 of FIG. 2. The sound output apparatus 400 according to the present invention uses an equal loudness contour based on the ISO226: 2003 of FIG. 2 and performs a procedure that a frequency bandwidth-based signal of an audio signal is corrected so that a user can hear the sounds of uniform levels at all frequency bandwidths.

For performing the above audio signal correction, the sound output apparatus 400 converts an equal loudness curve data of the ISO266:2003 based on the dB HL scale stored in the memory 420 into a data of a SPL (Sound Pressure Level) scale.

The sound output apparatus 400 adapts a noise criteria curve (approximate threshold hearing for continuous noise) to an equal loudness curve converted into the SPL scale for thereby minimizing the effects by noises. As shown in FIG. 3, the noise criteria reference curve based on the ISO standard may be used. In the present invention, an equalization is performed so that an audio signal is maintained within a range from NC-200 level to NC-40 level after the equalization is performed using the noise criteria curve based on the ISO standard.

Next, the sound output apparatus 400 preferably equalizes an audio signal using an equal loudness curve data which adapts a noise criteria curve. Here, the equalization is performed using an equal loudness curve data which adapts a sound criteria curve with respect to the frequency bandwidths of 250 Hz, 500 Hz, 1 KHz, 2 KHz, 4 KHz and 8 KHz.

Finally, the sound output apparatus 400 linearly processes an audio signal of a frequency bandwidth close to the bandwidths of 250 Hz and 9 KHz of an audio signal after the signal is equalized based on the frequency bandwidth. In case of 250 Hz and 8 KHz, the uneasiness of sound is minimized by linearly adapting a close frequency based on the frequency equalizer values.

When a standard equalization is set in the memory of the sound output apparatus 400, it is not needed to perform the above procedure. Namely, the sound output apparatus 400 equalizes and outputs an audio signal inputted depending on the standard equalization setting stored in the memory 420.

INDUSTRIAL APPLICABILITY

As described above, the present invention may be applied to communication equipment such as a telephone terminal, a transmitter, a repeater, etc. for thereby enhancing communication equality along with an improved sound cleanness and sound quality.

In addition, the present invention may be applied to a sound instrument such as a MP3, a common audio system, a car audio system, etc. for thereby enhancing a sound cleanness and sound quality and hearing protection effect. It may be used for a hearing aid.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The invention claimed is:

1. In a method for equalizing an audio signal of a communication repeater, communication equipment and a sound instrument, an equalization method using a standard equal loudness curve, comprising:
 a step for equalizing an audio signal using a standard audiogram, said standard audiogram is an equal loudness contour based on the ISO266:2003 standard, for increasing a loudness of an audio signal.

2. The method of claim 1, wherein said equalization method using a standard audiogram characteristic comprises:
 a step (a1) for converting an equal loudness curve data of the ISO266:2003 based on a dB HL scale into a data of a SPL; and
 a step (b) for equalizing an audio signal using an equal loudness curve data of the SPL converted in the step (a1).

3. The method of claim 2, wherein said equalization method using a standard audiogram characteristic comprises:
 a step (a2) for adapting a noise criteria curve data to an equal loudness curve of the SPL scale converted in the step (a1); and
 a step (b) for equalizing an audio signal using a data computed in the step (a2).

4. The method of claim 3, wherein in said step (b), the audio signals of frequency bandwidths of 250 Hz, 500 Hz, 1 KHz, 2 KHz, 4 KHz and 8 KHz are equalized using a data computed in the step (a2).

5. The method of claim 4, wherein said equalization method using the standard audiogram characteristic further comprises a step for linearly processing a signal of a frequency bandwidth close to the bandwidths of 250 Hz and 8 KHz of the audio signals equalized in the step (b).

6. In a sound output apparatus for converting an electric audio signal into an audible sound, a sound correction output apparatus using a standard equal loudness curve, comprising:
- an interface which is connected with a sound instrument and receives an audio signal from the sound instrument;
- a memory which stores a standard audiogram (equal loudness contour based on the ISO266:2003 standard);
- an audio signal process unit which equalizes an audio signal inputted via the interface in accordance with a standard audiogram stored in the memory;
- an output unit which coverts an analog signal, which is outputted from the audio signal process unit, into a sound and outputs the same; and
- a control unit which controls the operations of the memory and the audio signal process unit.

7. The apparatus of claim 6, wherein an equalization is performed based on the standard audiogram, the audio signal process unit converts an equal loudness contour data of the ISO266:2003 standard based on a dB HL scale, which is stored in the memory, into a data of the SPL scale when the audio signal process unit equalizes signals in accordance with a standard equal loudness curve, and equalizes an audio signal using an equal loudness curve data of the SPL scale.

8. The apparatus of claim 7, wherein said audio signal process unit equalizes an audio signal by adapting a noise criteria curve to the equal loudness curve data of the converted SPL scale when an equalization is performed based on the standard audiogram.

9. The apparatus of claim 8, wherein said audio signal process unit equalizes audio signals of the frequency bandwidths of 250 Hz, 500 Hz, 1 KHz, 2 KHz, 4 KHz, and 8 KHz when an equalization is performed based on the standard audiogram.

10. The apparatus of claim 9, wherein said audio signal process unit linearly processes the signals of frequency bandwidths close to the bandwidths of 250 Hz and 8 KHz of the equalized signals when an equalization is performed based on a standard audiogram and outputs the same.

11. In a sound output apparatus for converting an electric audio signal into an audible sound, a sound correction output apparatus using a standard equal loudness curve, comprising:
- an interface which is connected with a sound instrument and receives an audio signal from the sound instrument;
- a memory which stores a standard equalization setting value;
- an audio signal process unit which equalizes an audio signal inputted via the interface in accordance with the standard equalization setting data stored in the memory and converts into an analog signal and amplifies the same;
- an output unit which coverts an analog signal, which is outputted from the audio signal process unit, into an analog audio signal and outputs the same; and
- a control unit which controls the operations of the memory and the audio signal process unit,
- wherein the standard equalization setting value is an equalization setting value generated by an equalization method using a standard equal loudness curve selected from claim 1.

* * * * *